US012568693B2

(12) United States Patent
Wang

(10) Patent No.: US 12,568,693 B2
(45) Date of Patent: Mar. 3, 2026

(54) HIGH-EFFICIENCY SILICON HETEROJUNCTION SOLAR CELL AND MANUFACTURING METHOD THEREOF

(71) Applicant: TONGWEI SOLAR (JINTANG) CO., LTD., Chengdu (CN)

(72) Inventor: Jinle Wang, Chengdu (CN)

(73) Assignee: TONGWEI SOLAR (JINTANG) CO., LTD., Chengdu City (CN)

( * ) Notice: Subject to any disclaimer, the term of this patent is extended or adjusted under 35 U.S.C. 154(b) by 141 days.

(21) Appl. No.: 17/789,741

(22) PCT Filed: Dec. 21, 2021

(86) PCT No.: PCT/CN2021/139981
§ 371 (c)(1),
(2) Date: Jun. 28, 2022

(87) PCT Pub. No.: WO2022/170860
PCT Pub. Date: Aug. 18, 2022

(65) Prior Publication Data
US 2024/0194812 A1      Jun. 13, 2024

(30) Foreign Application Priority Data

Feb. 9, 2021    (CN) .......................... 202110175285.2

(51) Int. Cl.
*H10F 10/166*       (2025.01)
*H10F 71/00*        (2025.01)
*H10F 77/14*        (2025.01)
(52) U.S. Cl.
CPC ......... *H10F 10/166* (2025.01); *H10F 71/121* (2025.01); *H10F 71/129* (2025.01); *H10F 77/14* (2025.01)

(58) Field of Classification Search
CPC .... H10F 10/166; H10F 71/121; H10F 71/129; H10F 77/14; H10F 71/138; H10F 77/244; H10F 77/311; H10F 71/103; H10F 77/211
See application file for complete search history.

(56) References Cited

U.S. PATENT DOCUMENTS

2002/0069911 A1*   6/2002  Nakamura ............ H10F 10/165
                                                              136/243
2012/0055547 A1     3/2012  Schultz-Wittmann et al.
(Continued)

FOREIGN PATENT DOCUMENTS

CN          102460715 A       5/2012
CN          108701736 A       10/2018
(Continued)

OTHER PUBLICATIONS

International Search Report from International Application No. PCT/CN2021/139981 mailed Dec. 21, 2021.
(Continued)

*Primary Examiner* — Michael Y Sun
(74) *Attorney, Agent, or Firm* — Ballard Spahr LLP

(57) ABSTRACT

The present disclosure discloses a high-efficiency silicon heterojunction (HJT) solar cell and a manufacturing method thereof, and belongs to the technical field of solar cells. In the solar cell of the present disclosure, an N-type crystal silicon wafer is successively provided with a thin $SiO_2$ layer, a hydrogenated amorphous carbon silicon oxide film layer, a carbon doped $SiO_2$ layer, an amorphous silicon doped N-type layer, a TCO conductive layer, and an electrode on a front surface; and successively provided with a thin $SiO_2$ layer, a hydrogenated amorphous carbon silicon oxide film layer, a carbon doped $SiO_2$ layer, an amorphous silicon doped P-type layer, a TCO conductive layer, and an electrode on a rear surface. The amorphous silicon doped P-type
(Continued)

layer includes a lightly boron doped amorphous silicon layer and a heavily boron doped amorphous silicon layer.

9 Claims, 1 Drawing Sheet

(56) References Cited

U.S. PATENT DOCUMENTS

| | | | |
|---|---|---|---|
| 2013/0112264 A1* | 5/2013 | Wang | H10F 77/1662 |
| | | | 136/258 |
| 2017/0222074 A1 | 8/2017 | Yamada et al. | |
| 2017/0236952 A1* | 8/2017 | Schultz-Wittmann | |
| | | | H10F 10/165 |
| | | | 136/256 |
| 2019/0006534 A1 | 1/2019 | Fujita et al. | |
| 2024/0170283 A1* | 5/2024 | Chandra | C23C 16/45536 |

FOREIGN PATENT DOCUMENTS

| | | | |
|---|---|---|---|
| CN | 109119491 | A | 1/2019 |
| CN | 109509807 | A | 3/2019 |
| CN | 208806263 | U | 4/2019 |
| CN | 111697110 | A | 9/2020 |
| CN | 112151636 | A | 12/2020 |
| CN | 112802910 | A | 5/2021 |
| CN | 215220730 | U | 12/2021 |

OTHER PUBLICATIONS

Examination Report for Australian Application No. 2021404856 mailed Jul. 24, 2023.
Extended European Search Report for European Application No. 21908075.1 mailed Jan. 25, 2024.
Ding , et al., "Mechanism for Crystalline Si Surface Passivation by The Combination of SiO2 Tunnel Oxide and Uc-SiC: H Thin Film", Phys. Status Solidi RRL 10, No. 3. DOI 10.1002/pssr.20150376, Dec. 11, 2015, pp. 233-236.

* cited by examiner

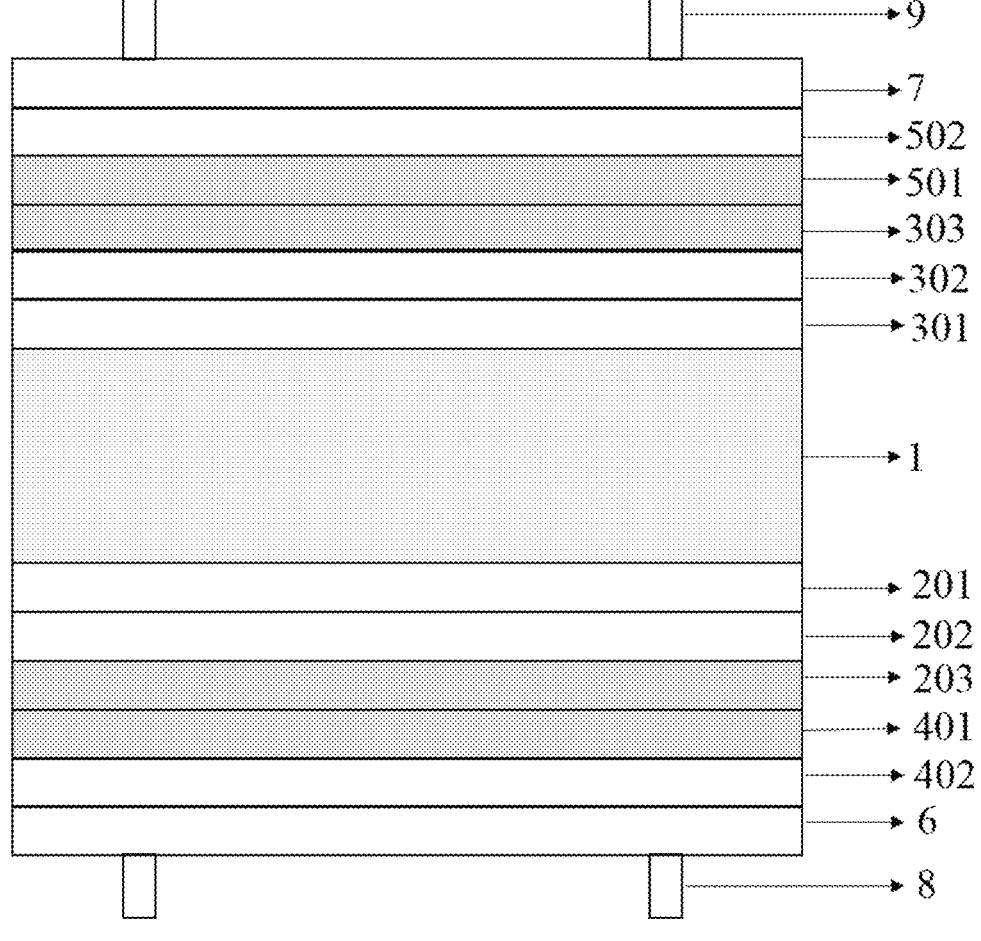

HIGH-EFFICIENCY SILICON HETEROJUNCTION SOLAR CELL AND MANUFACTURING METHOD THEREOF

CROSS-REFERENCES TO RELATED APPLICATIONS

This application is a U.S. national stage of PCT Patent Application No. PCT/CN2021/139981, entitled "HIGH-EF-FICIENCY SILICON HETEROJUNCTION SOLAR CELL AND MANUFACTURING METHOD THEREOF", filed on Dec. 21, 2021; which claims priority to Chinese Patent Application No. 2021101752852, entitled "HIGH-EFFI-CIENCY SILICON HETEROJUNCTION SOLAR CELL AND MANUFACTURING METHOD THEREOF" and filed with the Chinese Patent Office on Feb. 9, 2021, the entire contents of each of which are incorporated herein by reference.

TECHNICAL FIELD

The present disclosure relates to the technical field of solar cells, and in particular, to a high-efficiency silicon heterojunction (HJT) solar cell and a manufacturing method thereof.

BACKGROUND

At present, mainstream cell products in the market are P-type monocrystalline PERC cells, but efficiency of the P-type monocrystalline PERC cells has reached an upper limit. However, with the continuous development of market demands and industry technologies, a technology of N-type crystalline silicon solar cells has received more and more attention in recent years, mainly including a passivated emitter rear totally diffused (n-PERT) cell, a tunnel oxide passivated contact (TOPCon) cell and an HJT cell. The N-type crystalline silicon solar cells enable a further break-through in the conversion efficiency of the crystalline silicon solar cells.

An existing HJT cell has a structure consisting of an intrinsic layer and a doped layer of amorphous silicon on two surfaces of N-type monocrystalline silicon. The intrinsic layer of amorphous silicon mainly passivates defects on a surface of crystalline silicon and reduces defect states on the surface, so as to reduce carrier recombination. The doped layer of amorphous silicon mainly forms a PIN junction and a field-effect passivation layer with the crystalline silicon. $SiO_2$ has excellent surface passivation performance and can effectively reduce interfacial state density, but $SiO_2$ has a wider energy gap than the amorphous silicon.

A silicon HJT cell is a solar cell in which an intrinsic hydrogenated amorphous silicon layer is added between an N-type amorphous silicon layer and a crystalline silicon substrate. The intrinsic amorphous silicon layer is config-ured to passivate a doped silicon substrate. However, an intrinsic amorphous silicon layer deposited on the crystalline silicon substrate produces microscopic defects due to the doping of a hydrogen element and H plasma bombardment, resulting in epitaxial growth during the formation of hydro-genated amorphous silicon, which affects a passivation effect and results in a low open-circuit voltage. Moreover, an epitaxial layer formed on the side of the silicon substrate towards a P-type amorphous silicon layer is within a built-in electric field, the epitaxial layer has great influence on a silicon HJT solar cell.

A main method to inhibit epitaxial growth of the hydro-genated amorphous silicon on the surface of crystalline silicon is that the amorphous silicon layer near the outermost surface of crystalline silicon is not doped with H. That is, the intrinsic amorphous silicon thin layer is in direct contact with a silicon substrate. In addition, an ultrathin intrinsic silicon oxide layer may be deposited at an interface of the crystalline silicon substrate on one side of the P-type amor-phous silicon layer, and then an intrinsic silicon layer is deposited. Oxygen doping in the intrinsic silicon oxide layer is used to inhibit epitaxial growth of an intrinsic amorphous silicon film and reduce the number of defects at the inter-face, so as to achieve a better passivation effect. However, diffusion of doped atoms in the doped layer towards the intrinsic layer also affects the passivation effect.

On the other hand, in the related art, an amorphous silicon doped P-type layer is completed by doping of $B_2H_6$. The amorphous silicon doped P-type layer formed by doping of $B_2H_6$ has poor thermal stability, and B atoms easily diffuse into the intrinsic layer of amorphous silicon, which affects the passivation effect of the intrinsic layer and leads to a low open-circuit voltage and low conversion efficiency of the solar cell. In addition, the amorphous silicon doped layer formed by doping of $B_2H_6$ has a low energy gap. As a result, more sunlight is absorbed, and optical losses are increased, leading to a low short-circuit current and low conversion efficiency of the solar cell.

Upon searching, in the Chinese patent number ZL 201811472120.6, entitled "emitter structure of crystalline silicon heterojunction solar cell and manufacturing method thereof", an N-type crystal silicon wafer is included, the N-type crystal silicon wafer is provided with an amorphous silicon intrinsic layer on each of front and rear surfaces, a TCO conductive film is arranged on an outer side of each of the amorphous silicon intrinsic layers, several Ag electrodes are arranged an outer side of each of the TCO conductive films, an amorphous silicon doped N-type layer is arranged between the amorphous silicon intrinsic layer and the TCO conductive film on one surface of the N-type crystal silicon wafer, and a TMB-doped layer and a $B_2H_6$-doped layer are arranged between the amorphous silicon intrinsic layer and the TCO conductive film on the other surface of the N-type crystal silicon wafer. In the application, the doping of TMB gas prevents diffusion of doped atoms B into the amorphous silicon intrinsic layer and increases the open-circuit voltage. The TMB gas has a large energy gap, so that light can more effectively pass through the doped layer, increasing the short-circuit current. $B_2H_6$ gas is used for doping on the side close to TCO, so that the conductivity of the doped layer is better. Photoelectric conversion efficiency of the HJT solar cell is improved. In the application, although the lightly boron doped layer is used to get close to the amorphous silicon intrinsic layer, part of B atoms may still diffuse into the amorphous silicon intrinsic layer, which may affect the film quality of the amorphous silicon intrinsic layer and reduce the open-circuit voltage to some extent.

SUMMARY

In order to overcome the shortcomings of the related art, the present disclosure provides a high-efficiency silicon HJT solar cell and a manufacturing method thereof. In the present disclosure, the hydrogenated amorphous carbon silicon oxide film layer is used as an HJT solar cell of an intrinsic passivation layer, which can achieve an excellent passiva-tion effect on a crystal silicon surface and reduce interfacial carrier recombination. At the same time, an improved double diffused B process is used to prevent a decrease in an energy gap and unnecessary passivation film doping caused by diffusion of B atoms into an intrinsic amorphous silicon layer during $B_2H_6$ doping, which improves conversion efficiency of the silicon HJT solar cell.

In order to achieve the above objective, the present disclosure provides the following technical solution.

The present disclosure provides a high-efficiency silicon HJT solar cell, including an N-type crystal silicon wafer, a thin $SiO_2$ layer, a hydrogenated amorphous carbon silicon oxide film layer, a carbon doped $SiO_2$ layer, an amorphous silicon doped N-type layer, a TCO conductive layer, and an electrode being successively arranged on a front surface of the N-type crystal silicon wafer; and a thin $SiO_2$ layer, a hydrogenated amorphous carbon silicon oxide film layer, a carbon doped $SiO_2$ layer, an amorphous silicon doped P-type layer, a TCO conductive layer, and an electrode being successively arranged on a rear surface of the N-type crystal silicon wafer.

Further, the thin $SiO_2$ layer has a thickness in a range from 1 nm to 3 nm, and passivates a surface of a silicon substrate.

Further, the hydrogenated amorphous carbon silicon oxide film layer has a thickness in a range from 2 nm to 10 nm and an energy gap in a range from 1.7 eV to 2.3 eV.

Further, the hydrogenated amorphous carbon silicon oxide film layer is non-stoichiometric and has a chemical formula expressed as a-SiOxCy:H, with a non-stoichiometric ratio x changing in a range from 0.05 to 0.95 and a non-stoichiometric ratio y changing in a range from 0.05 to 0.95.

Further, the carbon doped $SiO_2$ layer has a thickness in a range from 1 nm to 5 nm, and a small number of lightly boron doped or lightly phosphorus doped atoms are contained in a manner of doping the $SiO_2$ layer with the same family, so as to prevent the influence on the passivation effect due to unnecessary doping of the intrinsic hydrogenated amorphous carbon silicon oxide film (a-SiOxCy:H) layer.

Further, the amorphous silicon doped P-type layer has a thickness in a range from 10 nm to 30 nm; the amorphous silicon doped P-type layer includes a lightly boron doped amorphous silicon layer and a heavily boron doped amorphous silicon layer, the lightly boron doped amorphous silicon layer is close to the carbon doped $SiO_2$ layer, and the heavily boron doped amorphous silicon layer is close to the TCO conductive layer.

Further, the lightly boron doped amorphous silicon layer is formed by TMB gas doping, and has a thickness in a range from 2 nm to 20 nm and an energy gap in a range from 1.7 eV to 1.8 eV.

Further, the heavily boron doped amorphous silicon layer is formed by $B_2H_6$ gas doping, and has a thickness in a range from 2 nm to 20 nm and an energy gap in a range from 1.4 eV to 1.6 eV.

Further, the amorphous silicon doped N-type layer has a thickness in a range from 10 nm to 30 nm; the amorphous silicon doped N-type layer includes a lightly phosphorus doped amorphous silicon layer and a heavily phosphorus doped amorphous silicon layer, the lightly phosphorus doped amorphous silicon layer is close to the carbon doped $SiO_2$ layer, and the heavily phosphorus doped amorphous silicon layer is close to the TCO conductive layer; the lightly phosphorus doped amorphous silicon layer has a thickness in a range from 2 nm to 20 nm, and the heavily phosphorus doped amorphous silicon layer has a thickness in a range from 2 nm to 20 nm. The heavily phosphorus doped amorphous silicon layer may be prepared by plasma chemical vapor deposition, or formed by laser heating and curing by coating the lightly phosphorus doped amorphous silicon layer with a liquid phosphorus source.

The present disclosure provides a manufacturing method for a high-efficiency silicon HJT solar cell, including the following steps:

texturing and cleaning the N-type crystal silicon wafer;

forming thin $SiO_2$ layers on two surfaces of the N-type crystal silicon wafer by thermal oxidation;

growing, by plasma enhanced chemical vapor deposition (PECVD), a hydrogenated amorphous carbon silicon oxide film layer on each of a front surface and a rear surface of the N-type crystal silicon wafer on which the thin $SiO_2$ layers are formed;

preparing a carbon doped $SiO_2$ layer by PECVD, wherein a C source is CO;

preparing an amorphous silicon doped N-type layer and an amorphous silicon doped P-type layer by PECVD; the amorphous silicon doped N-type layer including a lightly phosphorus doped amorphous silicon layer (i.e., an N-type amorphous silicon layer lightly doped with P atoms) and a heavily phosphorus doped amorphous silicon layer (i.e., an N-type amorphous silicon layer heavily doped with P atoms), and the amorphous silicon doped P-type layer including a P-type amorphous silicon layer lightly doped with B atoms formed by TMB gas doping and a P-type amorphous silicon layer heavily doped with B atoms formed by $B_2H_6$ gas doping;

depositing a TCO conductive layer by reactive ion deposition or sputtering; and forming front and rear Ag electrodes by screen printing, and curing the front and rear Ag electrodes, so as to form good ohmic contact with the TCO conductive film.

Further, the growing, by PECVD, a hydrogenated amorphous carbon silicon oxide film layer on each of a front surface and a rear surface of the N-type crystal silicon wafer (1) on which the thin $SiO_2$ layers are formed includes: vacuuming to below $5\times10^{-4}$ Pa, taking $H_2$ and $SiH_4$ as reaction gases and CO as a carbon source, and providing an oxygen source to grow the hydrogenated amorphous carbon silicon oxide film layer under conditions that the N-type crystal silicon wafer is at a temperature in a range from 150° C. to 300° C. and deposition pressure is in a range from 10 Pa to 100 Pa, wherein a percentage of a volume of carbon monoxide in a sum of volumes of carbon monoxide and $SiH_4$ is between 5% and 30%.

Further, the preparing an amorphous silicon doped N-type layer and an amorphous silicon doped P-type layer by PECVD includes: after base vacuum of a vacuum chamber reaches $5\times10^{-4}$ Pa, growing the amorphous silicon doped N-type layer and the amorphous silicon doped P-type layer on the hydrogenated amorphous carbon silicon oxide film layer on the rear surface at a temperature of a silicon wafer substrate in a range from 100° C. to 300° C. by taking $H_2$, $SiH_4$, doped TMB, $B_2H_6$, and $PH_3$ as reaction gases, and deposition pressure in a range from 10 Pa to 300 Pa.

Further, the depositing a TCO conductive layer by reactive ion deposition or sputtering includes: depositing a transparent conductive ITO film on each of the front and rear surfaces by magnetron sputtering, the film having a thickness in a range from 70 nm to 110 nm, transmittance above 98%, and sheet resistance in a range from 50Ω/□ to 100Ω/□.

Further, the forming front and rear electrodes by screen printing includes: printing another layer of low-temperature conductive silver paste on the TCO conductive layers on the front and rear surfaces by screen printing, and then sintering the low-temperature conductive silver paste at a low temperature in a range from 150° C. to 300° ° C. to form good ohmic contact; an Ag electrode having a thickness in a range from 5 μm to 50 μm, a width in a range from 20 μm to 60 μm, and a spacing in a range from 1 mm to 5 mm.

The technical solution according to the present disclosure has the following significant effects compared with existing conventional arts.

(1) In the high-efficiency silicon HJT solar cell of the present disclosure, a surface of a silicon substrate is passivated by a high-quality thin $SiO_2$ layer to passivate broken bonds on the surface of crystalline silicon, and an intrinsic hydrogenated amorphous carbon silicon oxide film (a-SiOxCy:H) layer can modulate an energy gap to provide excellent passivation performance and provide a hydrogen passivation interface.

(2) In the high-efficiency silicon HJT solar cell of the present disclosure, a small number of lightly boron doped or lightly phosphorus doped atoms diffusing into the intrinsic hydrogenated amorphous carbon silicon oxide film (a-SiOxCy:H) layer are contained in a manner of doping the $SiO_2$ layer with the same family, so as to prevent unnecessary doping of the intrinsic hydrogenated amorphous carbon silicon oxide film (a-SiOxCy:H) layer and ensure the passivation effect.

(3) In the high-efficiency silicon HJT solar cell of the present disclosure, P-type and N-type heavily doped amorphous silicon layers can form good electrical contact with the TCO layer. The amorphous silicon doped P-type layer on a backlight surface is of a dual stacked structure, and TMB gas is used for doping near the carbon doped $SiO_2$ layer to prevent the diffusion of the doped atoms B (boron) into the intrinsic layer of amorphous silicon, so as to ensure a passivation effect of intrinsic amorphous silicon and increase an open-circuit voltage Voc. The doped amorphous silicon layer close to crystalline silicon is doped with TMB gas, and has a large energy gap, so the light can pass through the doped layer in a higher proportion, thereby increasing absorption of the light by crystalline silicon and increasing a short-circuit current Isc. The doped amorphous silicon layer close to one side of the TCO is heavily doped with $B_2H_6$ gas. The conductivity of the doped layer is better, and series resistance Rs of the solar cell is lower, so that a filling factor (FF) is higher. Finally, the photoelectric conversion efficiency of the HJT solar cell is improved.

BRIEF DESCRIPTION OF THE DRAWINGS

FIG. 1 is a structural diagram of a high-efficiency silicon HJT solar cell according to the present disclosure.

1: N-type crystal silicon wafer; 201 (301): thin $SiO_2$ layer; 202 (302): hydrogenated amorphous carbon silicon oxide film layer; 203 (303): carbon doped $SiO_2$ layer; 401: lightly boron doped amorphous silicon layer; 402: heavily boron doped amorphous silicon layer; 501: lightly phosphorus doped amorphous silicon layer; 502: heavily phosphorus doped amorphous silicon layer; 6 (7): TCO conductive layer; 8 (9): electrode.

DETAILED DESCRIPTION OF THE EMBODIMENTS

In order to further understand the content of the present disclosure, the present disclosure is described in detail with reference to the accompanying drawings and embodiments.

Embodiment 1

Referring to FIG. 1, a high-efficiency silicon HJT solar cell in this embodiment includes an N-type crystal silicon wafer 1. A thin $SiO_2$ layer 301, a hydrogenated amorphous carbon silicon oxide film layer 302, a carbon doped $SiO_2$ layer 303, an amorphous silicon doped N-type layer, a TCO conductive layer 7, and an electrode 9 are successively arranged on a front surface of the N-type crystal silicon wafer 1. A thin $SiO_2$ layer 201, a hydrogenated amorphous carbon silicon oxide film layer 202, a carbon doped $SiO_2$ layer 203, an amorphous silicon doped P-type layer, a TCO conductive layer 6, and an electrode 8 are successively arranged on a rear surface of the N-type crystal silicon wafer 1.

The high-quality thin $SiO_2$ layer has a thickness of 1 nm, and passivates a surface of a silicon substrate.

The hydrogenated amorphous carbon silicon oxide film layer has a thickness of 2 nm. In this embodiment, the hydrogenated amorphous carbon silicon oxide film layer is non-stoichiometric and has a chemical formula expressed as a-SiOxCy:H, with a non-stoichiometric ratio x changing in a range from 0.05 to 0.95 and a non-stoichiometric ratio y changing in a range from 0.05 to 0.95. By changing the non-stoichiometric ratios x and y, the energy gap may be adjusted in a range from 1.7 eV to 2.3 eV.

Silicon carbide is an important anti-reflection layer and a passivation layer of a crystalline silicon cell. In combination with advantages of silicon oxide, silicon carbide, and intrinsic amorphous silicon, the hydrogenated amorphous carbon silicon oxide film (a-SiOxCy:H) layer can be obtained by adjusting the composition. By changing the non-stoichiometric ratios x and y, the performance of the hydrogenated amorphous carbon silicon oxide film layer, such as optical energy gap, can be adjusted to achieve excellent passivation performance and a thick film thickness.

In this embodiment, the hydrogenated amorphous carbon silicon oxide film layer has a non-stoichiometric ratio x of 0.05 and a non-stoichiometric ratio y of 0.95, and the energy gap may be modulated to 2.3 eV.

The carbon doped $SiO_2$ layer has a thickness of 1 nm.

The amorphous silicon doped P-type layer has a thickness of 10 nm, and the amorphous silicon doped N-type layer has a thickness of 10 nm. The TCO conductive layer has a thickness of 70 nm.

In this embodiment, a surface of a silicon substrate is passivated by a high-quality thin $SiO_2$ layer to passivate broken bonds on the surface of crystalline silicon, and an intrinsic hydrogenated amorphous carbon silicon oxide film (a-SiOxCy:H) layer can modulate an energy gap to provide excellent passivation performance and provide a hydrogen passivation interface.

Embodiment 2

A high-efficiency silicon HJT solar cell in this embodiment is basically the same as that in Embodiment 1, except that the high-quality thin $SiO_2$ layer has a thickness of 3 nm. The hydrogenated amorphous carbon silicon oxide film layer has a thickness of 10 nm. The hydrogenated amorphous carbon silicon oxide film layer has a non-stoichiometric ratio x of 0.95, a non-stoichiometric ratio y of 0.05, and an energy gap of 1.7 eV. The carbon doped $SiO_2$ layer has a thickness of 5 nm. The amorphous silicon doped P-type layer has a thickness of 30 nm, and the amorphous silicon doped N-type layer has a thickness of 30 nm. The TCO conductive layer has a thickness of 110 nm.

Embodiment 3

Referring to FIG. 1, a high-efficiency silicon HJT solar cell in this embodiment includes an N-type crystal silicon wafer 1. A thin $SiO_2$ layer 301, a hydrogenated amorphous carbon silicon oxide film layer 302, a carbon doped $SiO_2$ layer 303, an amorphous silicon doped N-type layer, a TCO conductive layer 7, and an electrode 9 are successively arranged on a front surface of the N-type crystal silicon wafer 1. A thin $SiO_2$ layer 201, a hydrogenated amorphous carbon silicon oxide film layer 202, a carbon doped $SiO_2$ layer 203, an amorphous silicon doped P-type layer, a TCO conductive layer 6, and an electrode 8 are successively arranged on a rear surface of the N-type crystal silicon wafer 1.

The high-quality thin $SiO_2$ layer has a thickness of 2 nm, and passivates a surface of a silicon substrate.

The hydrogenated amorphous carbon silicon oxide film layer has a thickness of 5 nm. In this embodiment, the hydrogenated amorphous carbon silicon oxide film layer has a non-stoichiometric ratio x of 0.55, a non-stoichiometric ratio y of 0.45, and an energy gap of 1.95 eV.

The carbon doped $SiO_2$ layer has a thickness of 3 nm, and a small number of lightly boron doped or lightly phosphorus doped atoms are contained in a manner of doping the $SiO_2$ layer with the same family, so as to prevent the influence on the passivation effect due to unnecessary doping of the intrinsic hydrogenated amorphous carbon silicon oxide film (a-SiOxCy:H) layer.

The amorphous silicon doped P-type layer has a thickness of 20 nm, the amorphous silicon doped P-type layer includes a lightly boron doped amorphous silicon layer 401 and a heavily boron doped amorphous silicon layer 402, the lightly boron doped amorphous silicon layer 401 is close to the carbon doped $SiO_2$ layer 203, and the heavily boron doped amorphous silicon layer 402 is close to the TCO conductive layer 6. By changing a doping source and a doping concentration, the energy gap of the doped layer can be modulated, and a doped layer with high thermal stability and a large energy gap can be formed on a light receiving surface, so that more incident light can pass through the doped layer on the light receiving surface and more light waves can be effectively absorbed to generate photon-generated carriers. In this embodiment, the lightly boron doped amorphous silicon layer 401 is formed by TMB gas doping, and has a thickness of 2 nm and an energy gap of 1.7 eV. The heavily boron doped amorphous silicon layer 402 is formed by $B_2H_6$ gas doping, and has a thickness of 18 nm and an energy gap of 1.4 eV.

The amorphous silicon doped N-type layer has a thickness of 20 nm. The amorphous silicon doped N-type layer includes a lightly phosphorus doped amorphous silicon layer 501 and a heavily phosphorus doped amorphous silicon layer 502, the lightly phosphorus doped amorphous silicon layer 501 is close to the carbon doped $SiO_2$ layer 303, and the heavily phosphorus doped amorphous silicon layer 502 is close to the TCO conductive layer 7. The lightly phosphorus doped amorphous silicon layer 501 has a thickness of 2 nm, and the heavily phosphorus doped amorphous silicon layer 502 has a thickness of 18 nm.

The TCO conductive layer has a thickness of 70 nm.

In this embodiment, a small number of lightly boron doped or lightly phosphorus doped atoms diffusing into the intrinsic hydrogenated amorphous carbon silicon oxide film (a-SiOxCy:H) layer are contained in a manner of doping the $SiO_2$ layer with the same family, so as to prevent unnecessary doping of the intrinsic hydrogenated amorphous carbon silicon oxide film (a-SiOxCy:H) layer and ensure the passivation effect. At the same time, P-type and N-type heavily doped amorphous silicon layers can form good electrical contact with the TCO layer. The P-type amorphous silicon doped layer on a backlight surface is of a dual stacked structure, and TMB gas is used for doping near the carbon doped $SiO_2$ layer to prevent the diffusion of the doped atoms B (boron) into the intrinsic layer of amorphous silicon, so as to ensure a passivation effect of intrinsic amorphous silicon and increase an open-circuit voltage Voc. The doped amorphous silicon layer close to crystalline silicon is doped with TMB gas, and has a large energy gap, so the light can pass through the doped layer in a higher proportion, thereby increasing absorption of the light by crystalline silicon and increasing a short-circuit current Isc. The doped amorphous silicon layer close to one side of the TCO is heavily doped with $B_2H_6$ gas. The conductivity of the doped layer is better, and series resistance Rs of the solar cell is lower, so that an FF is higher. Finally, the photoelectric conversion efficiency of the HJT solar cell is improved.

A preparation process for a high-efficiency silicon HJT solar cell in this embodiment includes the following steps.

In step one, the N-type crystal silicon wafer 1 is textured and cleaned.

In step two, thin $SiO_2$ layers are formed on two surfaces of the N-type crystal silicon wafer 1 by thermal oxidation.

In step three, a hydrogenated amorphous carbon silicon oxide film layer is grown, by PECVD, on each of a front surface and a rear surface of the N-type crystal silicon wafer 1 on which the thin $SiO_2$ layers are formed. In an embodiment, vacuuming to below $5 \times 10^{-4}$ Pa is performed, $H_2$ and $SiH_4$ are taken as reaction gases, CO is taken as a carbon source, and an oxygen source is provided to grow the hydrogenated amorphous carbon silicon oxide film layer under conditions that the N-type crystal silicon wafer 1 is at a temperature of 150° C. and deposition pressure is 10 Pa. A percentage of a volume of carbon monoxide in a sum of volumes of carbon monoxide and $SiH_4$ is 5%.

In step four, a carbon doped $SiO_2$ layer is prepared by PECVD, wherein a C source is CO.

In step five, an amorphous silicon doped N-type layer and an amorphous silicon doped P-type layer are prepared by PECVD. The amorphous silicon doped N-type layer includes a lightly phosphorus doped amorphous silicon layer (i.e., an N-type amorphous silicon layer lightly doped with P atoms) and a heavily phosphorus doped amorphous silicon layer (i.e., an N-type amorphous silicon layer heavily doped with P atoms), and the amorphous silicon doped P-type layer includes a P-type amorphous silicon layer lightly doped with B atoms formed by TMB gas doping and a P-type amorphous silicon layer heavily doped with B atoms formed by $B_2H_6$ gas doping.

A deposition process of the doped layers involves: after base vacuum of a vacuum chamber reaches $5 \times 10^{-4}$ Pa, growing the amorphous silicon doped N-type layer and the amorphous silicon doped P-type layer on the hydrogenated amorphous carbon silicon oxide film layer on the rear surface at a temperature of a silicon wafer substrate of 100°

C. by taking $H_2$, $SiH_4$, doped TMB, $B_2H_6$, and $PH_3$ as reaction gases, and deposition pressure of 10 Pa.

In step six, a transparent conductive ITO film is deposited on each of the front and rear surfaces by magnetron sputtering, wherein the film has transmittance above 98% and sheet resistance of 50Ω/□.

In step seven, another layer of low-temperature conductive silver paste is printed on the TCO conductive layers on the front and rear surfaces by screen printing, and then sintered at a low temperature of 150° ° C. to form good ohmic contact. An Ag electrode has a thickness of 5 μm, a width of 20 μm, and a spacing of 1 mm.

The HJT solar cell with non-stoichiometric hydrogenated amorphous silicon oxide films as an intrinsic passivation layer and a double diffused boron doped P-type layer has photoelectric conversion efficiency above 24.2%, and the short-circuit current and the open-circuit voltage are increased significantly.

Embodiment 4

A high-efficiency silicon HJT solar cell in this embodiment is basically the same as that in Embodiment 3, except the following differences.

The amorphous silicon doped P-type layer has a thickness of 10 nm, and the lightly boron doped amorphous silicon layer 401 has a thickness of 8 nm and an energy gap of 1.8 eV. The heavily boron doped amorphous silicon layer 402 has a thickness of 2 nm and an energy gap of 1.6 eV.

The amorphous silicon doped N-type layer has a thickness of 10 nm, the lightly phosphorus doped amorphous silicon layer 501 has a thickness of 8 nm, and the heavily phosphorus doped amorphous silicon layer 502 has a thickness of 2 nm.

A preparation process for a high-efficiency silicon HJT solar cell in this embodiment includes the following steps.

In step one, the N-type crystal silicon wafer 1 is textured and cleaned.

In step two, thin $SiO_2$ layers are formed on two surfaces of the N-type crystal silicon wafer 1 by thermal oxidation.

In step three, a hydrogenated amorphous carbon silicon oxide film layer is grown, by PECVD, on each of a front surface and a rear surface of the N-type crystal silicon wafer 1 on which the thin $SiO_2$ layers are formed. In an embodiment, vacuuming to below $5 \times 10^{-4}$ Pa is performed, $H_2$ and $SiH_4$ are taken as reaction gases, CO is taken as a carbon source, and an oxygen source is provided to grow the hydrogenated amorphous carbon silicon oxide film layer under conditions that the N-type crystal silicon wafer 1 is at a temperature of 180° C. and deposition pressure is 30 Pa. A percentage of a volume of carbon monoxide in a sum of volumes of carbon monoxide and $SiH_4$ is 5%.

In step four, a carbon doped $SiO_2$ layer is prepared by PECVD, wherein a C source is CO.

In step five, an amorphous silicon doped N-type layer and an amorphous silicon doped P-type layer are prepared by PECVD. A deposition process of the doped layers involves: after base vacuum of a vacuum chamber reaches $5 \times 10^{-4}$ Pa, growing the amorphous silicon doped N-type layer and the amorphous silicon doped P-type layer on the hydrogenated amorphous carbon silicon oxide film layer on the rear surface at a temperature of a silicon wafer substrate of 150° C. by taking $H_2$, $SiH_4$, doped TMB, $B_2H_6$, and $PH_3$ as reaction gases, and deposition pressure of 50 Pa.

In step six, a transparent conductive ITO film is deposited on each of the front and rear surfaces by magnetron sputtering, wherein the film has a thickness of 80 nm, transmittance above 98% and sheet resistance of 50Ω/□.

In step seven, another layer of low-temperature conductive silver paste is printed on the TCO conductive layers on the front and rear surfaces by screen printing, and then sintered at a low temperature of 150° ° C. to form good ohmic contact. An Ag electrode has a thickness of 15 μm, a width of 30 μm, and a spacing of 3 mm.

Embodiment 5

A high-efficiency silicon HJT solar cell in this embodiment is basically the same as that in Embodiment 3, except the following differences.

The amorphous silicon doped P-type layer has a thickness of 30 nm, and the lightly boron doped amorphous silicon layer 401 has a thickness of 18 nm and an energy gap of 1.75 eV. The heavily boron doped amorphous silicon layer 402 has a thickness of 12 nm and an energy gap of 1.5 eV.

The amorphous silicon doped N-type layer has a thickness of 30 nm, the lightly phosphorus doped amorphous silicon layer 501 has a thickness of 18 nm, and the heavily phosphorus doped amorphous silicon layer 502 has a thickness of 12 nm.

A preparation process for a high-efficiency silicon HJT solar cell in this embodiment includes the following steps.

In step one, the N-type crystal silicon wafer 1 is textured and cleaned.

In step two, thin $SiO_2$ layers are formed on two surfaces of the N-type crystal silicon wafer 1 by thermal oxidation.

In step three, a hydrogenated amorphous carbon silicon oxide film layer is grown, by PECVD, on each of a front surface and a rear surface of the N-type crystal silicon wafer 1 on which the thin $SiO_2$ layers are formed. In an embodiment, vacuuming to below $5 \times 10^{-4}$ Pa is performed, $H_2$ and $SiH_4$ are taken as reaction gases, CO is taken as a carbon source, and an oxygen source is provided to grow the hydrogenated amorphous carbon silicon oxide film layer under conditions that the N-type crystal silicon wafer 1 is at a temperature of 300° C. and deposition pressure is 100 Pa. A percentage of a volume of carbon monoxide in a sum of volumes of carbon monoxide and $SiH_4$ is 30%.

In step four, a carbon doped $SiO_2$ layer is prepared by PECVD, wherein a C source is CO.

In step five, an amorphous silicon doped N-type layer and an amorphous silicon doped P-type layer are prepared by PECVD. A deposition process of the doped layers involves: after base vacuum of a vacuum chamber reaches $5 \times 10^{-4}$ Pa, growing the amorphous silicon doped N-type layer and the amorphous silicon doped P-type layer on the hydrogenated amorphous carbon silicon oxide film layer on the rear surface at a temperature of a silicon wafer substrate of 300° C. by taking $H_2$, $SiH_4$, doped TMB, $B_2H_6$, and $PH_3$ as reaction gases, and deposition pressure of 300 Pa.

In step six, a transparent conductive ITO film is deposited on each of the front and rear surfaces by reactive ion deposition, wherein the film has a thickness of 110 nm, transmittance above 98% and sheet resistance of 100 Ω/□.

In step seven, another layer of low-temperature conductive silver paste is printed on the TCO conductive layers on the front and rear surfaces by screen printing, and then sintered at a low temperature of 190° ° C. to form good ohmic contact. An Ag electrode has a thickness of 50 μm, a width of 60 μm, and a spacing of 5 mm.

The present disclosure and implements thereof are illustrated above, but the description is not restrictive. The accompanying drawings are only one of the implementations of the present disclosure, and an actual structure is not limited thereto. Therefore, if those of ordinary skill in the art are inspired to design structures and embodiments similar to the technical solution without departing from the creation purpose of the present disclosure and without creativity, such structures and embodiments fall within the protection scope of the present disclosure.

What is claimed is:

1. A high-efficiency silicon heterojunction (HJT) solar cell, comprising:

an N-type crystal silicon wafer, a first thin $SiO_2$ layer, a first hydrogenated amorphous carbon silicon oxide film layer, a first carbon doped $SiO_2$ layer, an amorphous silicon doped N-type layer, a first TCO conductive layer, and a front electrode being successively arranged on a front surface of the N-type crystal silicon wafer; and a second thin $SiO_2$ layer, a second hydrogenated amorphous carbon silicon oxide film layer, a second carbon doped $SiO_2$ layer, an amorphous silicon doped P-type layer, a second TCO conductive layer, and rear electrode being successively arranged on a rear surface of the N-type crystal silicon wafer;

wherein the amorphous silicon doped P-type layer has a thickness in a range from 10 nm to 30 nm; the amorphous silicon doped P-type layer comprises a lightly boron doped amorphous silicon layer and a heavily boron doped amorphous silicon layer, the lightly boron doped amorphous silicon layer is close to the second carbon doped $SiO_2$ layer, and the heavily boron doped amorphous silicon layer is close to the second TCO conductive layer.

2. The high-efficiency silicon HJT solar cell according to claim 1, wherein each of the first thin $SiO_2$ layer and the second thin $SiO_2$ layer has a thickness in a range from 1 nm to 3 nm.

3. The high-efficiency silicon HJT solar cell according to claim 1, wherein each of the first hydrogenated amorphous carbon silicon oxide film layer and the second hydrogenated amorphous carbon silicon oxide film layer has a thickness in a range from 2 nm to 10 nm and an energy gap in a range from 1.7 eV to 2.3 eV.

4. The high-efficiency silicon HJT solar cell according to claim 3, wherein each of the first hydrogenated amorphous carbon silicon oxide film layer and the second hydrogenated amorphous carbon silicon oxide film layer is non-stoichiometric and has a chemical formula expressed as a-SiOxCy: H, with a non-stoichiometric ratio x changing in a range from 0.05 to 0.95 and a non-stoichiometric ratio y changing in a range from 0.05 to 0.95.

5. The high-efficiency silicon HJT solar cell according to claim 4, wherein each of the first carbon doped $SiO_2$ layer and the second carbon doped $SiO_2$ layer has a thickness in a range from 1 nm to 5 nm.

6. The high-efficiency silicon HJT solar cell according to claim 1, wherein the lightly boron doped amorphous silicon layer is formed by TMB gas doping, and has a thickness in a range from 2 nm to 20 nm and an energy gap in a range from 1.7 eV to 1.8 eV.

7. The high-efficiency silicon HJT solar cell according to claim 6, wherein the heavily boron doped amorphous silicon layer is formed by $B_2H_6$ gas doping, and has a thickness in a range from 2 nm to 20 nm and an energy gap in a range from 1.4 eV to 1.6 eV.

8. The high-efficiency silicon HJT solar cell according to claim 1, wherein the amorphous silicon doped N-type layer has a thickness in a range from 10 nm to 30 nm; the amorphous silicon doped N-type layer comprises a lightly phosphorus doped amorphous silicon layer and a heavily phosphorus doped amorphous silicon layer, the lightly phosphorus doped amorphous silicon layer is close to the first carbon doped $SiO_2$ layer, and the heavily phosphorus doped amorphous silicon layer is close to the first TCO conductive layer; the lightly phosphorus doped amorphous silicon layer has a thickness in a range from 2 nm to 20 nm, and the heavily phosphorus doped amorphous silicon layer has a thickness in a range from 2 nm to 20 nm.

9. The high-efficiency silicon HJT solar cell according to claim 7, wherein the amorphous silicon doped N-type layer has a thickness in a range from 10 nm to 30 nm; the amorphous silicon doped N-type layer comprises a lightly phosphorus doped amorphous silicon layer and a heavily phosphorus doped amorphous silicon layer, the lightly phosphorus doped amorphous silicon layer is close to the first carbon doped $SiO_2$ layer, and the heavily phosphorus doped amorphous silicon layer is close to the first TCO conductive layer; the lightly phosphorus doped amorphous silicon layer has a thickness in a range from 2 nm to 20 nm, and the heavily phosphorus doped amorphous silicon layer has a thickness in a range from 2 nm to 20 nm.

* * * * *